(12) United States Patent
Yang et al.

(10) Patent No.: US 11,125,804 B2
(45) Date of Patent: Sep. 21, 2021

(54) FAILURE POSITIONING METHOD

(71) Applicant: Shanghai Huali Integrated Circuit Mfg. Co., Ltd., Shanghai (CN)

(72) Inventors: Lingye Yang, Shanghai (CN); Li Sun, Shanghai (CN)

(73) Assignee: Shanghai Huali Integrated Circuit Mfg. Co. Ltd., Shanghai (CN)

( * ) Notice: Subject to any disclaimer, the term of this patent is extended or adjusted under 35 U.S.C. 154(b) by 95 days.

(21) Appl. No.: 16/681,792

(22) Filed: Nov. 12, 2019

(65) Prior Publication Data

US 2020/0191859 A1 Jun. 18, 2020

(30) Foreign Application Priority Data

Dec. 12, 2018 (CN) .......................... 201811518811.5

(51) Int. Cl.
*G01R 31/26* (2020.01)
*G01R 31/30* (2006.01)
*G06T 7/00* (2017.01)

(52) U.S. Cl.
CPC ..... *G01R 31/2644* (2013.01); *G01R 31/2607* (2013.01); *G01R 31/3004* (2013.01);
(Continued)

(58) Field of Classification Search
CPC ............ G01R 31/2607; G01R 31/2644; G01R 31/3004; H01L 22/14; H01L 22/22; H01L 29/4238; H01L 21/02271; H01L 27/3248; H01L 27/3276; H01L 29/66734; H01L 29/78391; H01L 27/0605; H01L 27/115; H01L 27/11517; H01L 27/1244; G02F 1/1309; G02F 1/136254; G06F 30/367; G06T 2207/10061; G06T 2207/30148; G06T 7/001

See application file for complete search history.

(56) References Cited

U.S. PATENT DOCUMENTS 6,766,274 B2 * 7/2004 Puthucode ......... G01R 31/3004
 702/181
8,299,463 B2 * 10/2012 Xiao .................... G01R 31/307
 257/48

(Continued)

*Primary Examiner* — Vinh P Nguyen
(74) *Attorney, Agent, or Firm* — Adsero IP

(57) ABSTRACT

A failure positioning method for positioning leakage defect cell between the gate and the active region of transistor cells arranged in an array. The positioning method includes the steps of: measuring the resistance between a first metal wire connecting the active regions and a second metal wire connecting the gates, and positioning a first region where the defect cell is located by resistance ratio; electrically isolating the active region contact holes and the gate contact holes from each other; shorting the gate contact holes in the first region; and performing active voltage contrast analysis on the plurality of columns of transistor cells in the first region to position the leakage defect in the first region by comparing the voltage contrast images. With the positioning method, the transistor cell having a leakage defect at nA level may be accurately found from a plurality of transistor cells arranged in an array. The positioning method helps to improve the yield of semiconductor device based on the above defect adjustment process.

10 Claims, 11 Drawing Sheets

(52) U.S. Cl.
CPC .... *G06T 7/001* (2013.01); *G06T 2207/10061* (2013.01); *G06T 2207/30148* (2013.01)

(56) References Cited

U.S. PATENT DOCUMENTS

| | | | | |
|---|---|---|---|---|
| 2006/0220240 | A1* | 10/2006 | Lee | G11C 29/006 |
| | | | | 257/734 |
| 2007/0036420 | A1* | 2/2007 | Enachescu | G09G 3/006 |
| | | | | 382/141 |

* cited by examiner

FAILURE POSITIONING METHOD

CROSS-REFERENCES TO RELATED APPLICATIONS

The present application claims priority to Chinese Patent Application No. 201811518811.5, filed on Dec. 12, 2018, entitled "A FAILURE POSITIONING METHOD", which is incorporated by reference herein for all purposes.

FIELD

The present invention relates to the field of semiconductor process failure analysis, and in particular to a positioning analysis method for positioning leakage failure between the gate and the active region of a semiconductor device.

BACKGROUND

In mass production of semiconductor devices, by performing failure analysis (FA) on the designed and fabricated semiconductor devices, defects may be found and corrected to solve the problems caused by defects. Therefore, failure analysis of semiconductor devices is very important for improving yield, and improving reliability and stability of process technology.

The conventional failure analysis process comprises electrical confirmation, failure positioning, and physical analysis to find the essential cause of failure, and failure positioning is a very critical step. However, trying to find a nano-sized failure position on a 10 mm×5 mm chip is as hardly as positioning a building on the earth, the complexity and difficulty of which is known.

Finding the failure point by failure positioning technology is extremely important in the analysis of semiconductor chips, and it is also extremely challenging and difficult. Currently, the failure positioning methods commonly used in the semiconductor industry include photon emission microscopy (EMMI), optical resistance change microscope (OBIRCH) and thermal emission microscopy (Thermal), etc. However, as the semiconductor process technology is increasingly advanced, the stability of the latter process is also increasingly strong, and the leakage of metal short circuit failure samples becomes very small. The failure position is thereby impossible to be accurately determined by using conventional positioning analysis methods.

According to the working principle of conventional EMMI, the positioned defects are generally defects of the front devices, and the short circuit defects of the rear metal interconnect layers are difficult to position.

According to the working principle of the conventional OBIRCH, the short circuit defects of the rear metal interconnect layers can be positioned. However, a long hot spot containing the short circuit position is often emphasized instead of only highlighting the short circuit position.

According to the working principle of the conventional Thermal, the front defects and the rear defects may be both positioned, while the heat released from the leakage position is required reaching several tens or even hundreds of mW, and the short circuit with nA (nano ampere) level leakage is not be positioned.

Therefore, a positioning method that can effectively position the metal short circuit with nA level leakage accurately is required, thereby helping to analyze the cause of the defects, and timely adjusting the semiconductor process to improve the yield of semiconductor devices.

SUMMARY OF THE INVENTION

A brief overview of one or more aspects is provided below to provide a basic understanding of these aspects. The summary is not an extensive overview of all of the aspects that are contemplated, and is not intended to identify key or decisive elements in all aspects. The sole purpose of the summary is to present some concepts of one or more aspects in a simplified form as a prelude to the more detailed description that is presented later.

In order to accurately position the leakage failure at nA level, the present invention provides a failure positioning method for positioning leakage defect cell between a gate and an active region of transistor cells arranged in an array, and the active region of each transistor cell is led out via active region contact holes, the gates of transistor cells in each column are led out via shared gate contact holes, a plurality of the active region contact holes are connected in series by a first metal wire, a plurality of the gate contact holes are connected in parallel by a second metal wire, the first metal wire and the second metal wire are located in a same lead layer, the positioning method comprises:

measuring a resistance between the first metal wire and the second metal wire, and positioning a first region where the defect cell is located by resistance ratio, and the first region comprises a plurality of columns of transistor cells;

removing the lead layer to expose a plurality of active region contact holes and a plurality of gate contact holes that are electrically isolated from each other;

shorting the gate contact holes in the first region; and performing active voltage contrast analysis on the plurality of columns of transistor cells in the first region to position the defect cell in the first region by comparing the voltage contrast images.

In one embodiment, the step of positioning the first region further comprises:

respectively measuring a resistance between a first end of the first metal wire and the second metal wire, and a resistance between a second end of the first metal wire and the second metal wire, and calculating the ratio of the two resistances to position the first region.

In one embodiment, the width of the first region corresponding to the plurality of columns of transistor cells in the first region is 15-20 um.

In one embodiment, all of the gate contact holes in the first region are shorted by depositing conductive medium covering each of the gate contact holes in the first region.

In one embodiment, the conductive medium is deposited by focused ion beam (FIB), and the conductive medium is as wide as the first region.

In one embodiment, the conductive medium is metal platinum.

In one embodiment, performing active voltage contrast analysis further comprises: applying a test voltage to each of the shorted gate contact holes in the first region by a probe; and acquiring a voltage contrast image of the plurality of columns of transistor cells in the first region, and the voltage contrast of the defect cell is different from the voltage contrast of other transistor cells.

In one embodiment, the test voltage is negative voltage.

In one embodiment, the probe is a nanoprobe.

In one embodiment, after positioning the defect cell, the positioning method further comprises:

observing and analyzing the defect cell by a transmission electron microscope to determine the cause and mechanism of leakage failure.

According to the failure positioning method provided by the present invention, combined with resistance ratio, voltage contrast analysis is used to gradually reduce the leakage region, thereby accurately positioning the transistor defect cell in which the gate and the active region are leaked

BRIEF DESCRIPTION OF THE DRAWINGS

FIGS. 8A-9A show the schematic diagram of a test piece observed by the method provided by the present invention via scanning electron microscope (SEM);

FIGS. 9B-10C show the schematic diagram of a defect observed via transmission electron microscope (TEM).

REFERENCE SIGNS 610 conductive medium
710 probe

DETAILED DESCRIPTION OF EMBODIMENTS

Embodiments of the present invention are described below by specific embodiments. Although the description of the present invention will be described in conjunction with the embodiments, this is not a limitation of the invention. Conversely, the invention is described in conjunction with the embodiments so as to cover other alternatives or modifications that are possible in the embodiments of the invention. In order to provide a thorough understanding of the present invention, many specific details are included in the following description. The invention may also be practiced without these details. In addition, some specific details are omitted in the description in order to avoid obscuring the present invention.

Note that in the case of use, the signs left, right, front, back, top, bottom, forward, reverse, clockwise and counter clockwise are used for convenience purposes only and do not imply any specific fixed direction. In fact, they are used to reflect the relative position and/or orientation between the various parts of the object.

Understandably, although the terms "first", "second", "third", etc. may be used to describe various parts, regions, layers and/or portions to distinguish different parts, regions, layers and/or portions, the order of these parts, regions, layers and/or portions described above should not be limited by the terms. Therefore, a first part, region, layer and/or portion mentioned below may be also mentioned as a second part, region, layer and/or portion without departing from some embodiments of the present invention.

Although the method is illustrated and described as a series of actions for the purpose of simplifying the explanation, it should be understood and appreciated that these methods are not limited by the order of the actions. In one embodiment, some actions may occur in different orders and/or concurrently with other actions that are illustrated and described herein or that are not illustrated and described herein, in accordance with one or more embodiments.

Figure 3:
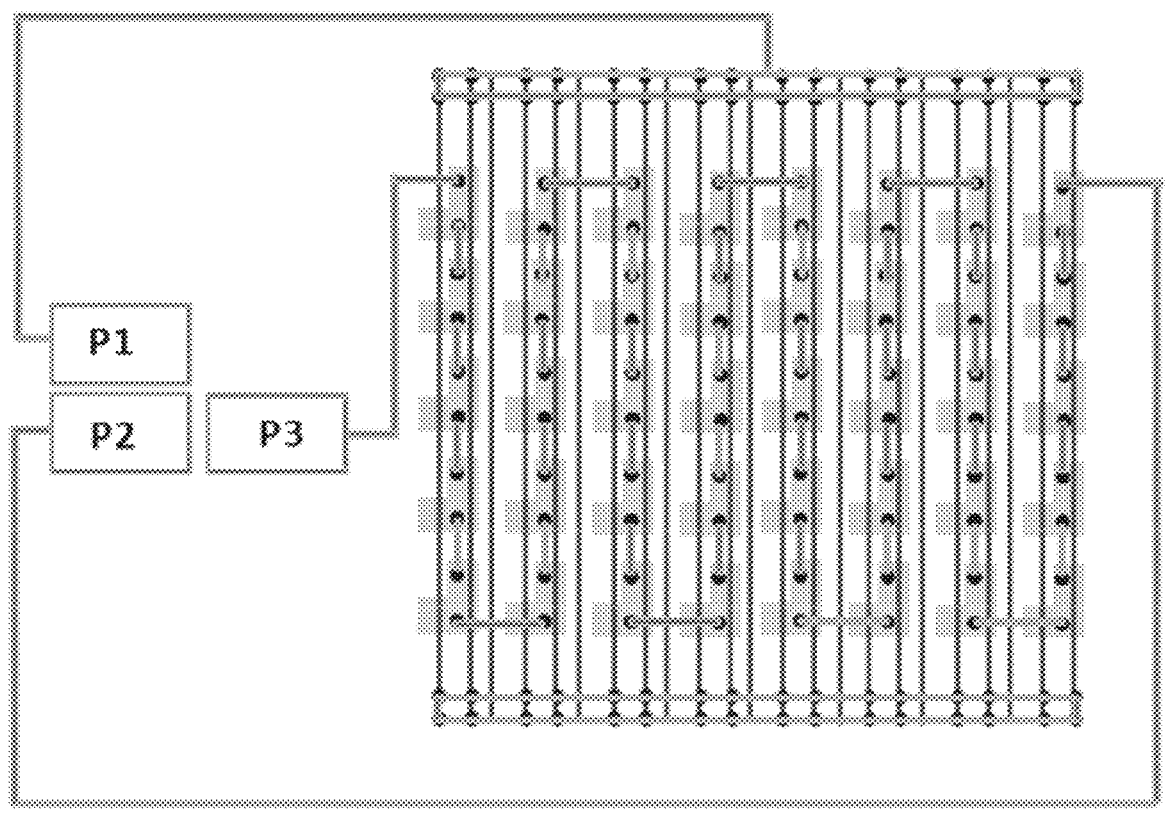
FIG. 3 shows the schematic diagram of the structure of a test piece.

As noted above, in order to monitor semiconductor processes, different test pieces may be designed to simulate the formation of semiconductor devices. In order to discover process defects that may exist in semiconductor process more proactively, the shapes of the test pieces are usually designed with maximum redundancy. Referring to FIG. 3, FIG. 3 shows the test piece of transistor cells arranged in an array.

As the top view shown in FIG. 3, each of the transistor cells comprises an active region in shape of inverted "L" and the active regions are arranged in an array, and each active region is led out via active region contact holes (the black dots in the active region in FIG. 3), the gates of transistor cells in each column (the black vertical lines in FIG. 3) are led out via shared gate contact holes (the black dots located above and below the array in FIG. 3). A plurality of active region contact holes are connected in series by a first metal wire, the two ends of which are respectively connected to PAD2 (P2) and PAD3 (P3). A plurality of gate contact holes are connected in parallel by a second metal wire, which is connected to PAD1 (P1). The first metal wire and the second metal wire are located in a same lead layer. The active regions are located on the substrate of a transistor cell. The gate is on the upper surface of the substrate. The active region contact holes and the gate contact holes are located above the active region and the gate. The lead layer is located above the active region contact holes and the gate contact holes.

Figure 2:
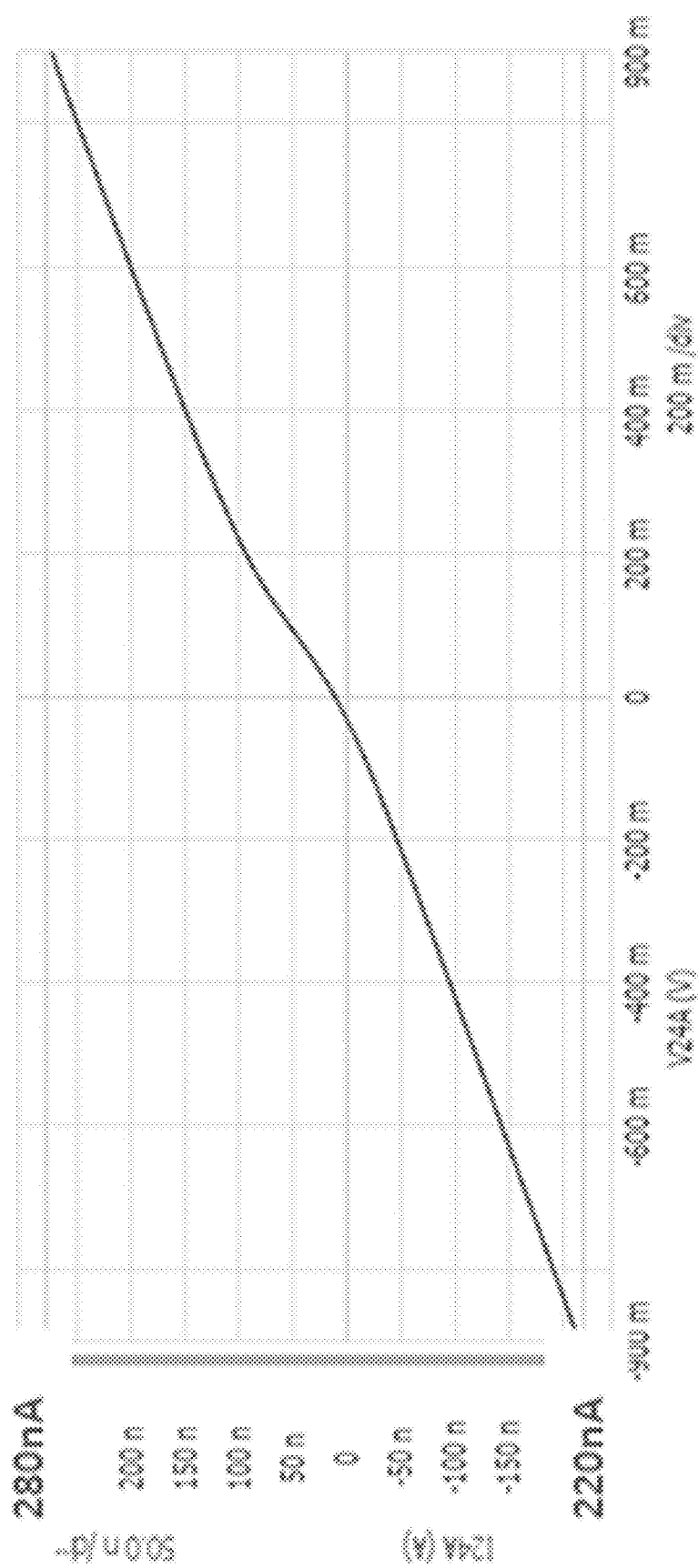
FIG. 2 shows the test electrical data of a test piece in the prior art.

As the test piece structure shown in FIG. 3, the transistor cells are designed as much as possible in the same area by the array arrangement for monitoring the leakage problems of the gates and the active regions. In the conventional detecting methods, leakage between the gate and the active region of a certain transistor cell in the test piece structure may be detected by electrical analysis. FIG. 2 shows the electrical data of the test structure. As shown in FIG. 2, there is leakage between the gate and the active region in the structure, and the leakage is at nA (nano ampere) level. However, the conventional EMMI, OBIRCH and thermal positioning methods cannot accurately position the failure.

Therefore, the present invention provides a failure positioning method for positioning leakage defect cell between the gate and the active region of transistor cells arranged in an array.

Figure 1:
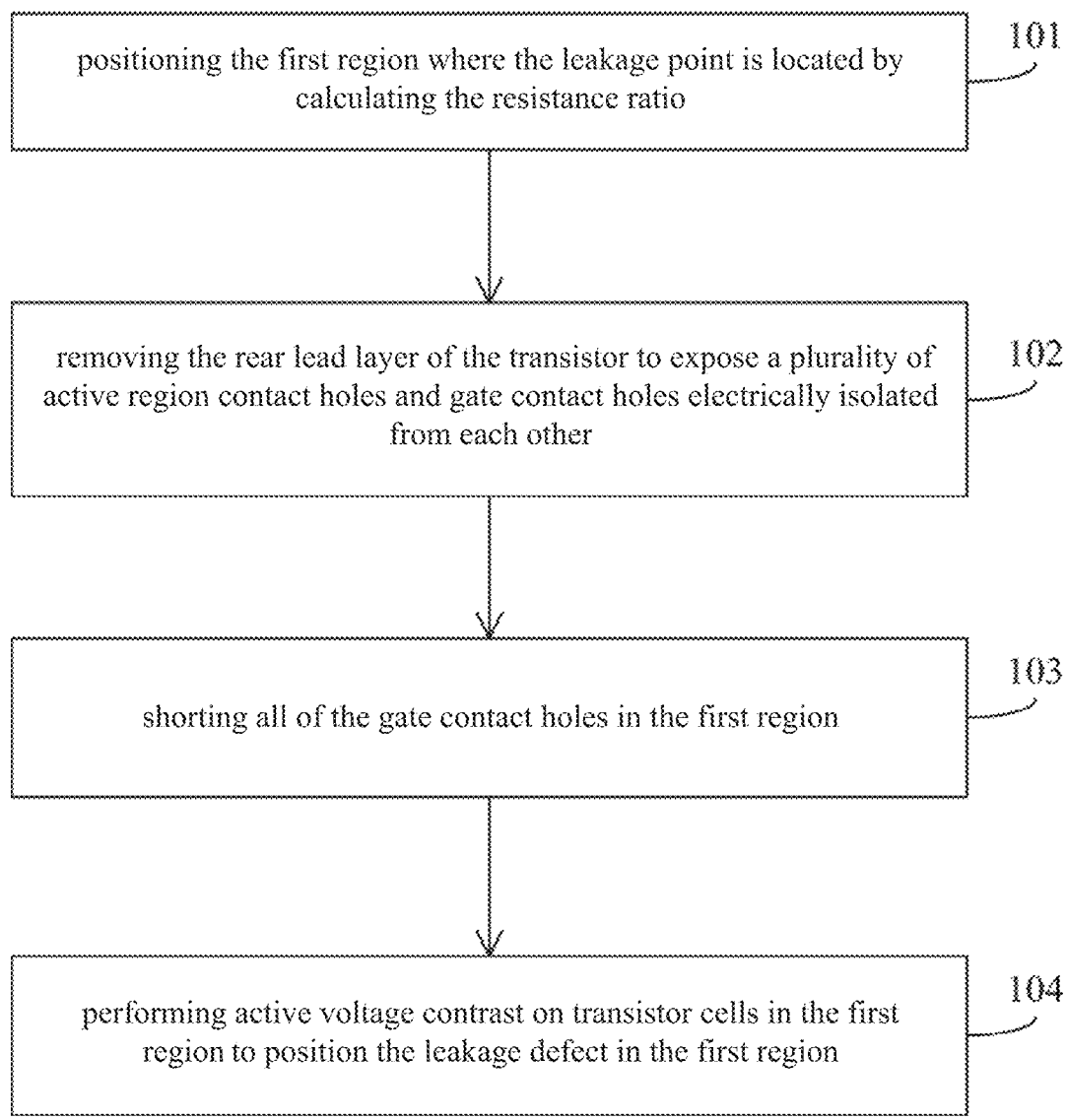
FIG. 1 shows the schematic diagram of a positioning method provided by the present invention.

FIG. 1 shows the schematic diagram of a positioning method provided by the present invention. As shown in FIG. 1, the positioning method provided by the present invention specifically comprises:

step 101: measuring the resistance between the first metal wire and the second metal wire, and positioning a first region where the defect cell is located by resistance ratio;

step 102: removing the lead layer to expose a plurality of active region contact holes and a plurality of gate contact holes that are electrically isolated from each other;

step 103: shorting the gate contact holes in the first region; and step 104: performing active voltage contrast analysis on the plurality of columns of transistor cells in the first region to position the defect cell in the first region by comparing the voltage contrast images.

Specific embodiments of the present invention will be further described below in conjunction with the schematic diagrams shown in FIGS. 3-7.

Firstly, step 101 is performed to determine the relative position of the leakage defect point by using resistance ratio method. Referring to FIG. 3 together, the specific method of step 101 is:

a) Firstly, the resistance R1 between P2 and P3 is measured, which characterizes the resistance of entire normal active region (CT/AA) structure.

Then, the resistance R2 between P1 and P2, and the resistance R3 between P1 and P3 are measured respectively.

b) The approximate area where the leakage defect point is located may be roughly positioned by the ratio of R2/R3, which means roughly positioning the first region where the leakage point is located, and generally locking the leakage defect point in the first region with a width of 15-20 um.

The first region comprises a plurality of columns of transistor cells. The range of the defects may be reduced while ensuring that the range covers the position of the resistance ratio, that is, the position of the defect.

c) The resistance of the leakage defect point may be roughly calculated by using the formula (R2+R3+R1)/2, which helps the tester to determine the possible cause of the leakage.

In one embodiment, the resistance measurement may be performed by conventional or upcoming resistance measuring tools and methods, which are not described herein.

Figure 4:
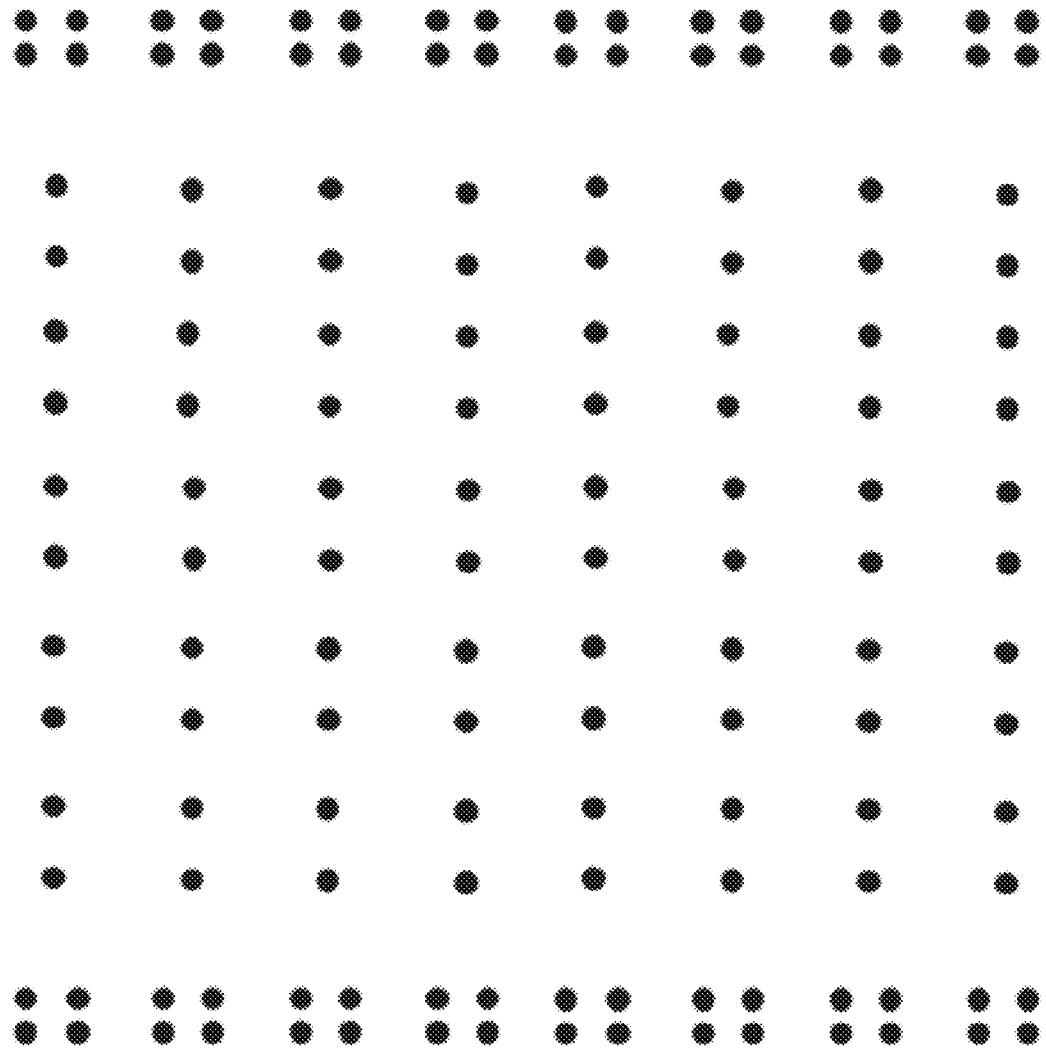
FIG. 4 shows the top view of the CT layer of a test piece as shown in FIG. 3.
Figure 5:
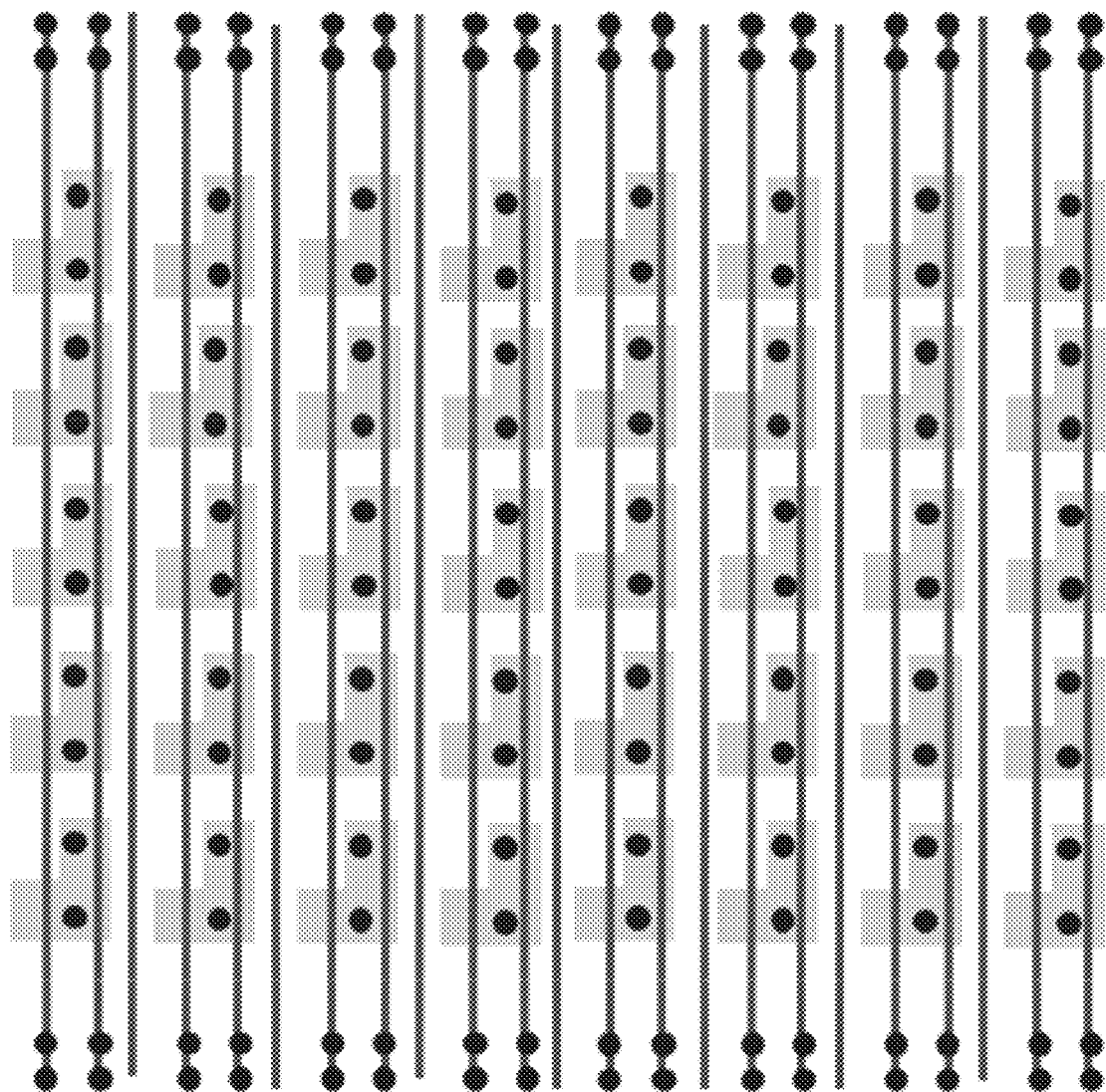
FIG. 5 shows the top view of a test piece after removing the rear metal as shown in FIG. 3.

After positioning the defect in the first region, step 102 is performed: removing the lead layer. Referring to FIGS. 4 and 5 together, FIG. 4 shows the top view of a test piece after an overall de-layering process to the contact hole CT layer. At this point, all active region contact holes (CT on AA) and gate contact holes (CT on Poly) are electrically isolated.

It should be noted that the term "electrical isolate" used in the present invention means that the active region contact holes are independent of each other without any connection, and/or the gate contact holes are independent from each other without any connection, and/or the active region contact holes and the gate contact holes are independent of each other without any connection.

Further, in the embodiment, electrical isolating all active region contact holes (CT on AA) and gate contact holes (CT on Poly) means that the active region contact holes are independent of each other without any connection, the gate contact holes are independent from each other without any connection, and the active region contact holes and the gate contact holes are independent of each other without any connection.

FIG. 5 further shows the perspective view of the test piece structure shown in FIG. 4. The test piece structure may be more clearly observed through the perspective view.

Figure 6:
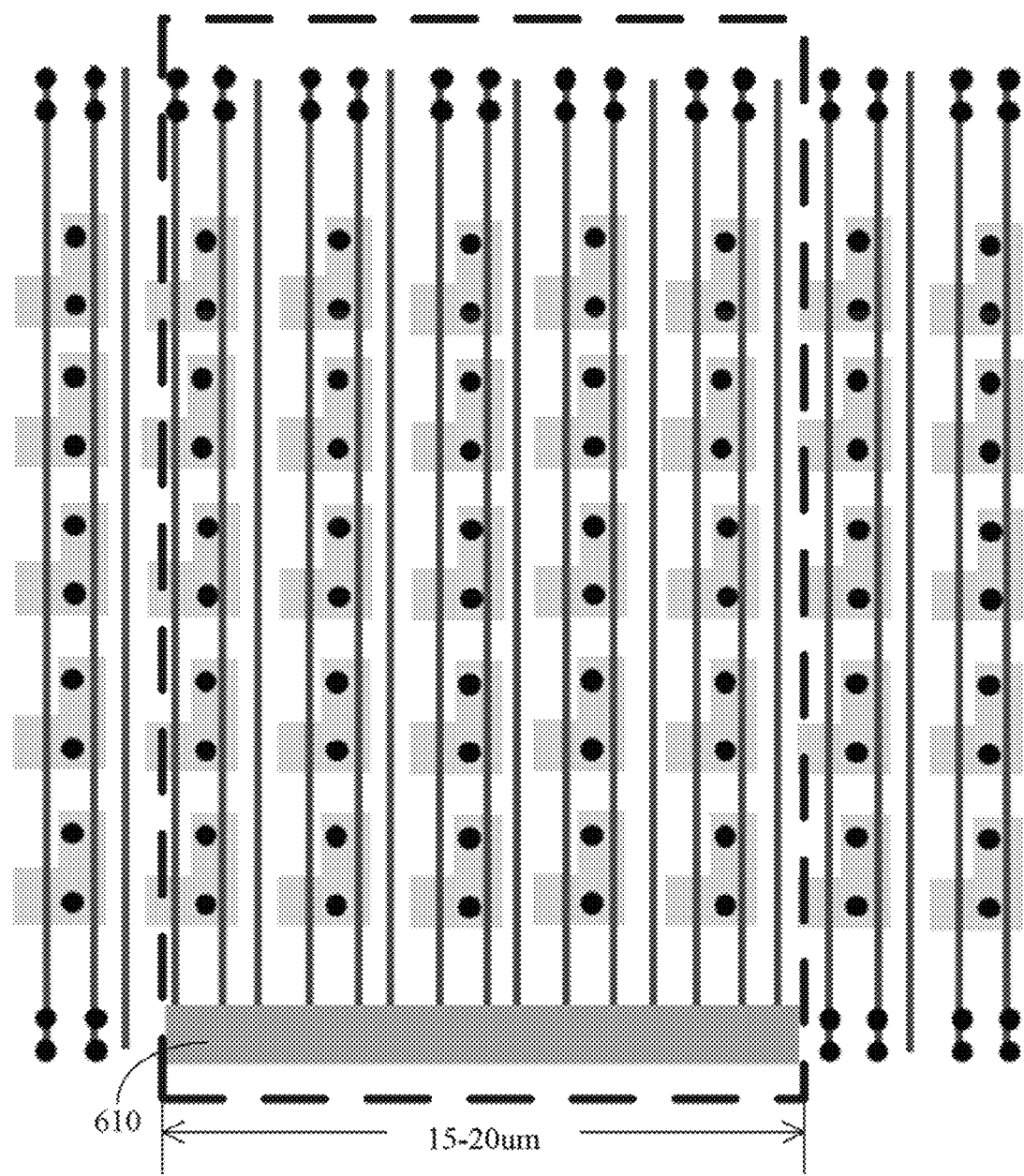
FIG. 6 shows the top view of a method of depositing conductive medium provided by the present invention.

Then, step 103 is performed: depositing conductive medium in the first region to short the gate contact holes in the first region. Further referring FIG. 6, the dotted frame in FIG. 6 shows the first region where the defect positioned by performing step 101 is located. The conductive medium 610 is deposited on the gate contact holes and covers the CT on the gates for the purpose of shorting all of the gates in the region covered by conductive medium to form an equipotential region of the gates.

In an embodiment, the conductive medium 610 is made of metal platinum (Pt). In an embodiment, the deposition described above is achieved by focused ion beam (FIB). In one embodiment, the above description is just an example of a specific method for implementing step 103, but not a limitation to the method for implementing step 103. In one embodiment, may implement step 103 by using conventional or upcoming materials and methods.

In an embodiment, the width of deposited conductive medium 610 is consistent with the width of the first region. In one embodiment, the width may be 15-20 um to contain the leakage defect point in the first region and to facilitate the operability of subsequent positioning process.

After performing step 103, the equipotential region of the gates has been formed. Since there is defect cell in which the gate and the active region are leaked in the first region, the active region and the active region contact holes leaked to the gate are thereby at same potential as the equipotential region of the gates. It is precisely because the active region and the active region contact holes of the defect cell are at same potential as the gates in the first region, while the active regions and the active region contact holes of the remaining normal cells in the test piece are at different potentials from the equipotential region of the gates, the defect cell may be thereby locked from a plurality of transistor cells arranged in an array.

Further, step 104 is performed to perform active voltage contrast to obtain a voltage contrast image to position the defect cell.

Figure 7:
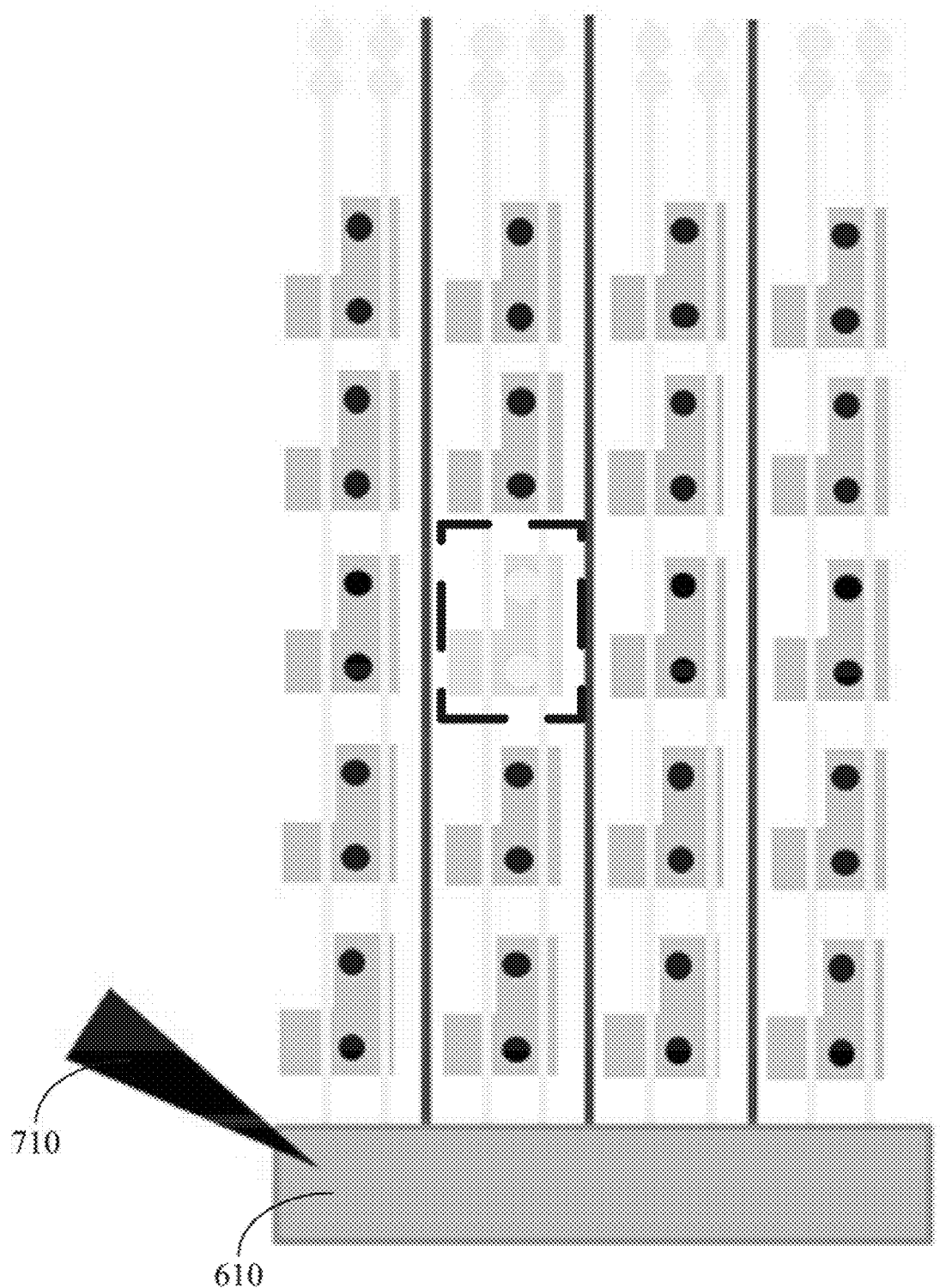
FIG. 7 shows the top view of a method of positioning defect cell provided by the present invention.

Referring to FIG. 7 together, a probe 710 is nailed on the conductive medium 610, and a suitable voltage is applied to the probe 710. A secondary electron image is observed by using scanning electron microscope (SEM) to obtain a voltage contrast image. According to the principle of active voltage contrast, the active region and the active region contact holes (CT/AA) leaked to the gate may show different voltage contrast from other active regions and active region contact holes (CT/AA) in the voltage contrast image (SEM image). Therefore, the active region and active region contact holes (CT/AA) leaked to the gate may be highlighted (as shown by the dashed frame in FIG. 7), thereby accurately positioning the defect.

In an embodiment, the probe 710 employed is implemented by nanoprob device. Therefore, the probe 710 described above may be a nano probe.

In the above embodiment, the test voltage applied by the probe 710 may be adjusted according to the structure of the test piece and the voltage that the test piece can withstand. In one embodiment, applying a positive test voltage on probe 710 may make the structure more floating, while applying a negative test point voltage may make the structure more grounded. For the test structure shown in FIG. 3, a negative voltage of −2V may be applied on the probe 710 to perform step 104.

After finding the defect cell, further analysis of the defect position by other analytical means such as transmission electron microscopy to determine the cause and mechanism of the failure leading to the leakage.

According to the positioning method provided by the present invention, the leakage position at nA (nano ampere) level leakage between front gate and active region with its contact holes (CT/AA) may be positioned to find the essential cause of the failure, which is of great help in solving the process problem and promoting the development progress.

The following is a practical example of positioning the leakage of front gate and active region with its contact holes (CT/AA) at nA level according to the method provided by the present invention. FIGS. 8A-10C may be further referred.

A 28HKC PDF test structure is used in the present invention, which has leakage problems between front gates and active region with its contact holes (CT/AA), and the electrical test leakage is at nA level. The defect may not be positioned by conventional positioning methods such as EMMI, OBIRCH and Thermal, while the positioning method provided by the present invention may accurately position the short circuit, and finally find the failure mechanism leading to leakage, providing powerful help to the development of new process.

Figure 8A:
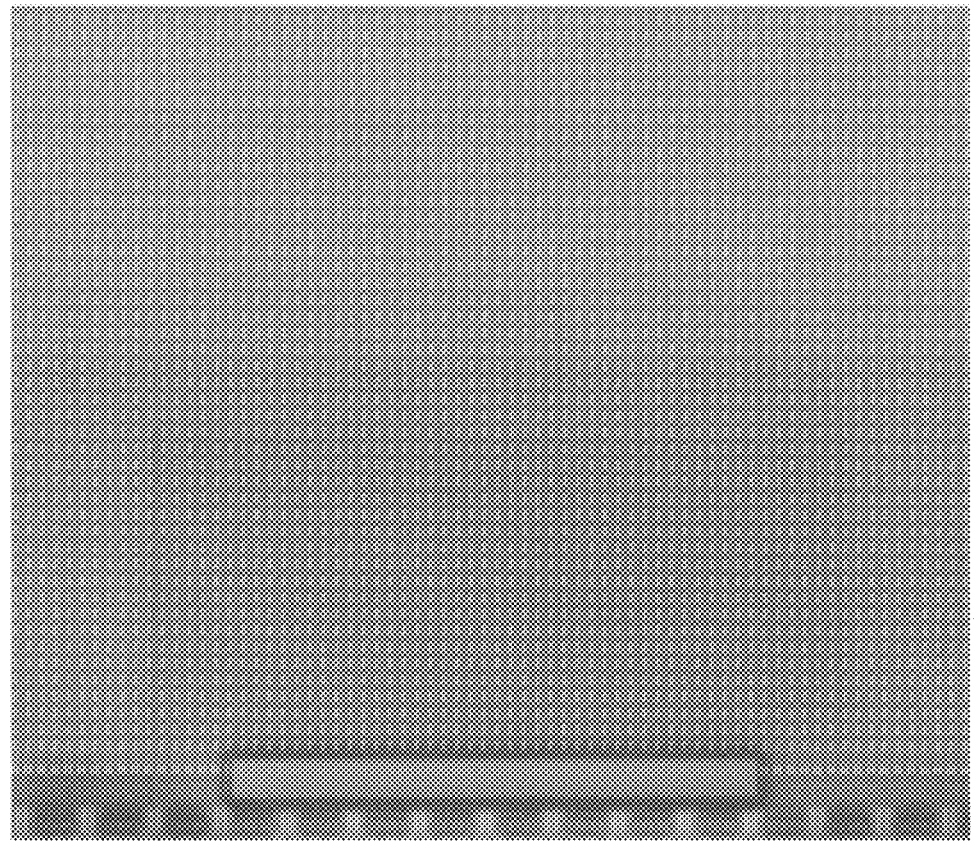
Figure 8B:
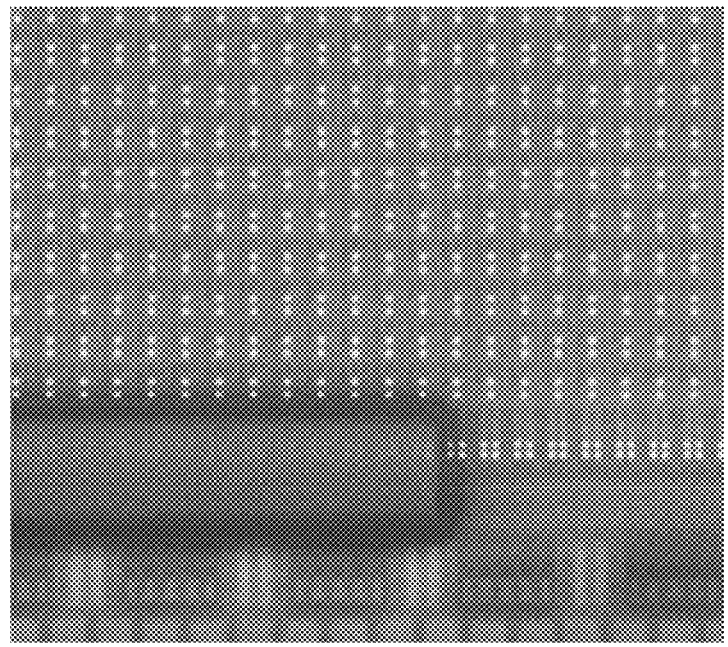

FIG. 8A discloses a SEM pattern of the sample that has been processed to the contact hole (CT) layer, with 15 um Pt plated in the resistance ratio region. FIG. 8B is an enlarged view of partial area of FIG. 8A.

Figure 9A:
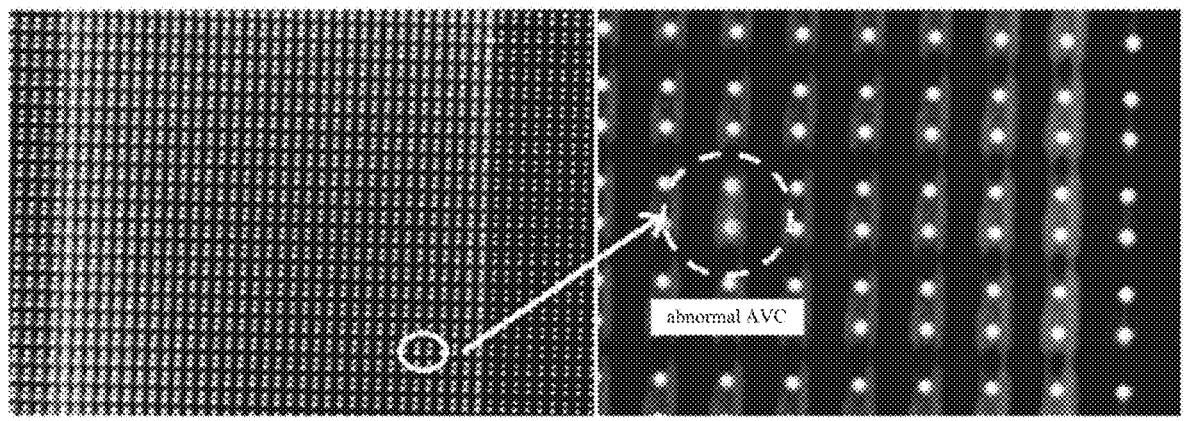

FIG. 9A shows an active voltage contrast (AVC) test performed by using nanoprob device. By applying a negative voltage to the Pt region by nanoprobe, the position of abnormal AVC, that is, the position of the defect may be found. The right side of FIG. 9A further magnifies the defect position. In one embodiment, although the above defect is not particularly apparent (the leakage is at nA level, and the defect is very small).

Figure 9B:
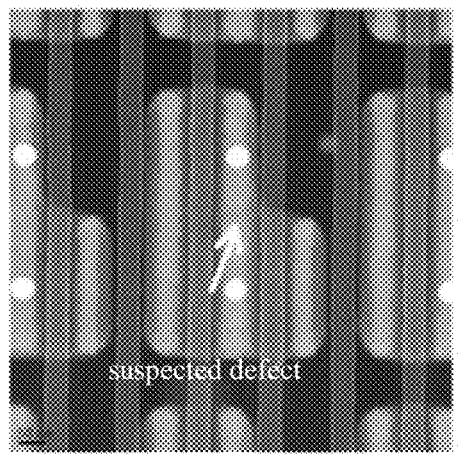

FIG. 9B shows the top view of transmission electron microscope (TEM) in the defect position for analyzing the defect cell to ultimately determine the failure mechanism.

Figure 10A:
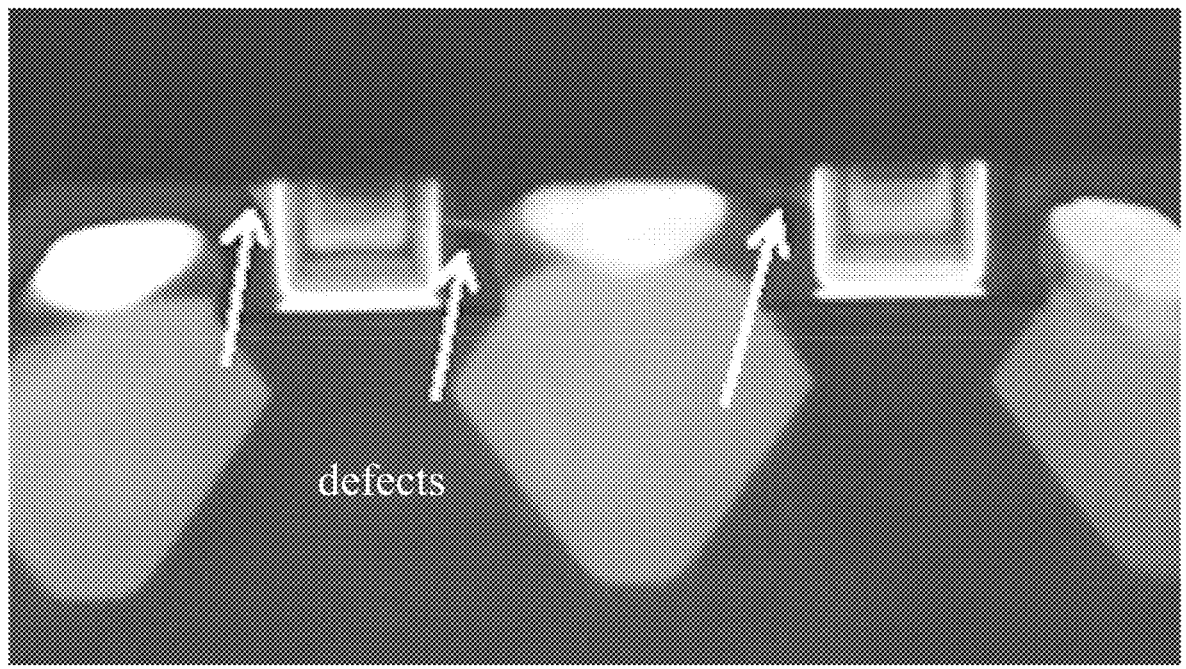
Figure 10B:
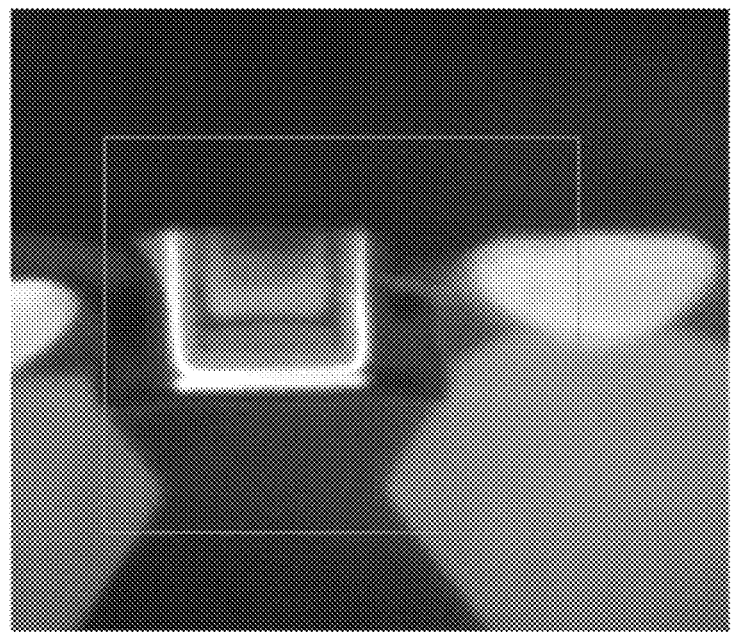
Figure 10C:
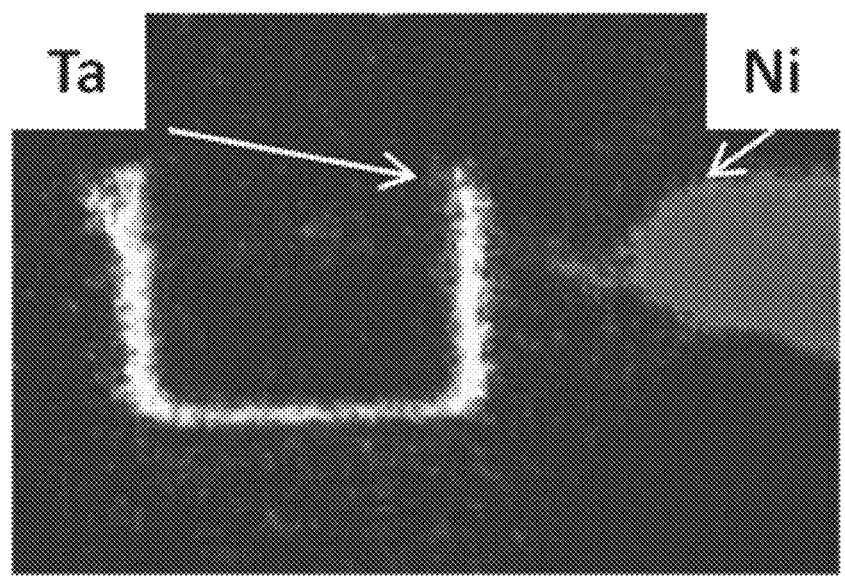

Further referring to FIGS. 10A-10C, FIG. 10A shows a cross sectional view of TEM of the defect cell, FIG. 10B further magnifies the area of FIG. 10A, and FIG. 10C shows the result of component analysis.

In one embodiment, the difference between the defect cell and the normal cells in the TEM plan view image is not very obvious, which is mainly because the defect leakage is very weak at nA level, as seen from the TEM sectional view as only a slight short circuit.

It is precisely because the above defect is very weak, the above defect may not be accurately positioned by conventional positioning means. However, by the positioning method provided by the present invention, the short circuit may be accurately positioned, and the failure mechanism leading to the leakage may be finally found, thereby providing a powerful help for the development of new process.

What is claimed is:

1. A failure positioning method for positioning leakage defect cell between a gate and an active region of transistor cells arranged in an array, wherein the active region of each transistor cell is led out via active region contact holes, the gates of transistor cells in each column are led out via shared gate contact holes, a plurality of the active region contact holes are connected in series by a first metal wire, a plurality of the gate contact holes are connected in parallel by a second metal wire, the first metal wire and the second metal wire are located in a same lead layer, the positioning method comprises:
    measuring a resistance between the first metal wire and the second metal wire, and positioning a first region where the defect cell is located by resistance ratio, wherein the first region comprises a plurality of columns of transistor cells;
    removing the lead layer to expose a plurality of active region contact holes and a plurality of gate contact holes that are electrically isolated from each other;
    shorting the gate contact holes in the first region; and
    performing active voltage contrast analysis on the plurality of columns of transistor cells in the first region to position the defect cell in the first region by comparing the voltage contrast images.

2. The positioning method of claim 1, wherein the step of positioning the first region further comprises:
    respectively measuring a resistance between a first end of the first metal wire and the second metal wire, and a resistance between a second end of the first metal wire and the second metal wire, and calculating the ratio of the two resistances to position the first region.

3. The positioning method of claim 1, wherein the width of the first region corresponding to the plurality of columns of transistor cells in the first region is 15-20 um.

4. The positioning method of claim 1, wherein all the gate contact holes in the first region are shorted by depositing conductive medium covering each of the gate contact holes in the first region.

5. The positioning method of claim 4, wherein the conductive medium is deposited by focused ion beam (FIB), and the conductive medium is as wide as the first region.

6. The positioning method of claim 4, wherein the conductive medium is metal platinum.

7. The positioning method of claim 1, wherein performing active voltage contrast analysis further comprises: applying a test voltage to each of the shorted gate contact holes in the first region by a probe; and
    acquiring a voltage contrast image of the plurality of columns of transistor cells in the first region, wherein the voltage contrast of the defect cell is different from the voltage contrast of other transistor cells.

8. The positioning method of claim 7, wherein the test voltage is negative voltage.

9. The positioning method of claim 7, wherein the probe is a nanoprobe.

10. The positioning method of claim 1, wherein after positioning the defect cell, the positioning method further comprises:
    observing and analyzing the defect cell by a transmission electron microscope to determine the cause and mechanism of leakage failure.

* * * * *